United States Patent [19]
Kemp

[11] Patent Number: 5,308,741
[45] Date of Patent: May 3, 1994

[54] LITHOGRAPHIC METHOD USING DOUBLE EXPOSURE TECHNIQUES, MASK POSITION SHIFTING AND LIGHT PHASE SHIFTING

[75] Inventor: Kevin G. Kemp, Austin, Tex.

[73] Assignee: Motorola, Inc., Schaumburg, Ill.

[21] Appl. No.: 922,409

[22] Filed: Jul. 31, 1992

[51] Int. Cl.$^5$ .............................................. G03C 5/00
[52] U.S. Cl. .................................. 430/312; 428/156;
  430/5; 430/22; 430/269; 430/311; 430/396
[58] Field of Search ................... 430/5, 22, 269, 311,
  430/312, 396; 428/156

[56] References Cited

U.S. PATENT DOCUMENTS

| | | | |
|---|---|---|---|
| 4,591,540 | 5/1986 | Bohlen et al. | 430/22 |
| 5,045,417 | 9/1991 | Okamoto | 430/5 |
| 5,153,083 | 10/1992 | Garofalo et al. | 430/5 |
| 5,194,344 | 3/1993 | Cathey, Jr. et al. | 430/5 |
| 5,194,345 | 3/1993 | Rolfson | 430/5 |
| 5,194,346 | 3/1993 | Rolfson et al. | 430/5 |

OTHER PUBLICATIONS

"Improving Resolution in Photolithography with a Phase-Shifting Mask," by Levensen et al., was published in IEEE Transactions on Electron Devices, vol. ED-29, No. 12, Dec. 1982, pp. 1828-1836.

"Sub-Quarter Micron Gate Fabrication Process Using Phase-Shifting-Mask for Microwave GaAs Devices" by Inokuchi et al., publ. in Ext. Abs. of '91 Int. Conf. on S. S. Dev. & Mat., Yoko., pp. 92-94.

Primary Examiner—John Kight, III
Assistant Examiner—Shelley Dodson
Attorney, Agent, or Firm—Keith E. Witek

[57] ABSTRACT

A lithographic method using double exposures, physical mask shifting, and light phase shifting is used to form masking features on a substrate masking layer. A first phase shifting mask (11) is placed in a first position adjacent a substrate (10). The substrate (10) is covered by the masking layer. The masking layer is exposed to light, or an equivalent energy source, through the first mask (11) to form a first plurality of unexposed regions of the masking layer. Either a second mask or the first mask (11) is placed adjacent the substrate (10) in a second position which is displaced from the first position in an X direction, a Y direction, and/or a rotational direction. A second exposure is used to form a second plurality of unexposed regions of the masking layer. The first and second pluralities of unexposed regions have common unexposed regions which are used to form the masking features.

28 Claims, 10 Drawing Sheets

LITHOGRAPHIC METHOD USING DOUBLE EXPOSURE TECHNIQUES, MASK POSITION SHIFTING AND LIGHT PHASE SHIFTING

FIELD OF THE INVENTION

The present invention relates generally to semiconductor technology, and more particularly, to phase shifting lithographic techniques.

BACKGROUND OF THE INVENTION

Lithography processing is a required and essential technology when manufacturing conventional integrated circuits. Many lithography techniques exist, and all lithography techniques are used for the purpose of defining geometries, features, lines, or shapes onto an integrated circuit die or wafer. In general, a radiation-sensitive material, such as photoresist, is coated over a top surface of a die or wafer to selectively allow for formation of the geometries, features, lines, or shapes.

A known method of lithography is generally referred to as photolithography. During a photolithographic step, photoresist is first formed over a top surface of a semiconductor wafer. A spin-on technique is usually used followed by a brief photoresist baking process. A mask having opaque regions, which are usually formed of chrome, and clear regions, which are usually formed of quartz, is positioned over the photoresist-coated wafer. Light is shone on the mask via a visible light source or an ultra-violet (UV) light source, such as a mercury-arc lamp or a mercury-vapor lamp. The light passes through all clear regions of the mask and is blocked by the opaque regions of the mask. The light exposure forms exposed portions of the photoresist on the semiconductor wafer and unexposed portions of the photoresist on the semiconductor wafer, respectively due to the clear and opaque regions of the mask.

In almost all cases, the light is reduced and focused via an optical system which contains one or several lenses, filters, and or mirrors before being exposed to the wafer. The optical system reduces feature sizes, sharpens imaging and in general improves the quality of the photolithographic process. Many techniques of photolithography such as contact printing, proximity printing, and projection printing are widely used in the integrated circuit industry. During contact printing the mask contacts the wafer during light exposure. During proximity printing the mask is positioned a short distance over the wafer. Projection printing usually involves multiple lenses wherein at least one lens is between the mask and the wafer. Photolithography, as conventionally practiced, is widely used but considered to be unfeasible for patterning features having a dimension less than 0.4 to 0.3 micron.

Another form of lithography is known as electron beam lithography or E-beam lithography (EBL). EBL technology allows for formation of small features without using a mask by focusing a thin electron beam onto a photoresist covered wafer. EBL is not used often in the integrated circuit industry due to the fact that EBL is extremely slow compared to other forms of lithography, and requires equipment which is usually three to five times more expensive than other widely used lithographic systems.

X-ray lithography is another technique that is used to form features onto a photoresist-covered wafer. X-ray lithography uses X-rays which are on the order of 0.4 to 5 nanometers in wavelength to form high-resolution features (i.e. very small features). Depth of focus problems, which are common to photolithography processing, are also reduced. X-ray lithography requires new photoresists or resist materials and can be cumbersome and expensive. In addition, X-ray masks are difficult to properly and consistently manufacture. Some known phenomena, such as lateral magnification error and blurring, are difficult problems that must be addressed when using X-ray lithography.

Another method of lithography which may be used for integrated circuit production is phase shifting. Phase shifting lithography is very similar to photolithography with the exception of the formation of the mask. A mask used for phase shifting lithographic systems has selectively-positioned phase shifting material and selectively positioned opaque material formed over a quartz plate. The quartz plate passes light which is referenced to be of a phase angle of 0°, and the phase shifting material passes light which is 180° out of phase with the 0° light. The 0° light has a positive light intensity that alters the molecular weight of the photoresist. Additionally, the 180° light also has a positive light intensity and alters the molecular weight of the photoresist in a manner identical to the 0° light. The regions between the 0° light and the 180° light destructively interferes to form "dark" regions of low light intensity. These dark regions, which lie along vertical planes of the boundaries between the phase shifting material and the quartz material, form unexposed regions of the photoresist. Therefore, depending upon the use of negative or positive photoresist, sub-micron or sub-photolithographic lines and spaces can be formed using phase shifting techniques.

Due to the fact that phase shifting features are formed around the edges of various phase shifting regions via destructive interference, the destructive interference generates cylindrical or annular unexposed regions only. Although annular masking features are useful, other geometries such as lines, contacts, and snaked features are required for integrated circuit formation. Conventional single exposure phase shifting techniques therefore have limited application and use.

SUMMARY OF THE INVENTION

The previously mentioned disadvantages are overcome and other advantages achieved with the present invention. In one form, the present invention comprises a method for forming masking features upon a semiconductor wafer wherein the semiconductor wafer has top surface made of a masking layer. A first phase shifting mask is positioned in a first position adjacent the semiconductor wafer. The masking layer is exposed to light wherein the light is passed through the first phase shifting mask. A second phase shifting mask is positioned in a second position adjacent the semiconductor wafer. The masking layer is exposed to light wherein the light is passed through the second phase shifting mask. In another form, the first and second masks are a single mask.

The present invention will be more clearly understood from the detailed description below in conjunction with the accompanying drawings.

DESCRIPTION OF A PREFERRED EMBODIMENT

Figure 1:
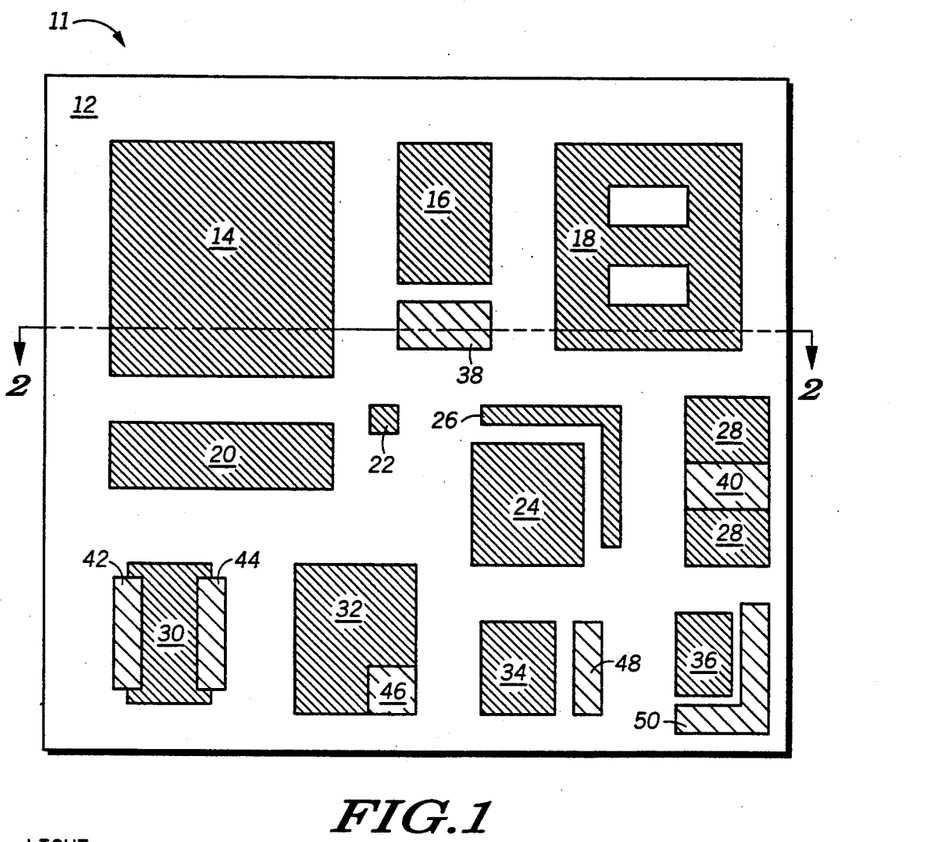
FIG. 1 illustrates in a top perspective view a phase shifting mask in accordance with the present invention.

Illustrated in FIG. 1 is a phase shifting mask 11. Phase shifting mask 11 is made from a translucent or transparent plate 12. The transparent plate 12 is preferably a quartz plate of a thickness which may be measured in millimeters. Other materials, such as calcium fluoride, are alternative transparent materials which may be used for transparent plate 12. Several phase shifting regions 14, 16, 18, 20, 22, 24, 26, 28, 30, 32, 34, and 36 are formed overlying the transparent plate 12. The phase shifting regions 14, 16, 18, 20, 22, 24, 26, 28, 30, 32, 34, and 36 may be any material which is transparent to light and has an index of refraction which is near in value to an index of refraction of the transparent plate 12. Some examples of appropriate phase shifting materials are oxides and nitrides. More specifically, oxides and nitrides may be materials such as silicon dioxide ($SiO_2$), silicon nitride, tetraethylorthosilicate (TEOS) based oxides, borophospho-silicate-glass (BPSG), phosphosilicate-glass (PSG), boro-silicate-glass (BSG), oxide-nitride-oxide (ONO), plasma enhanced silicon nitride ($P-SiN_x$), a spin on glass (SOG), composite oxides and/or nitride materials, and/or like dielectric materials. These materials are formed by conventional and well-known deposition and etch techniques.

The mask 11 also has opaque regions 38, 40, 42, 44, 46, 48, and 50 which are optional. The opaque regions 38, 40, 42, 44, 46, 48, and 50 are usually made of chrome, chrome oxide over chrome, or other known opaque materials which may be formed over transparent plate 12. The portions of the phase shifting regions 14, 16, 18, 20, 22, 24, 26, 28, 30, 32, 34, and 36 may lie directly adjacent, in contact with, underlying or overlying the opaque regions 38, 40, 42, 44, 46, 48, and 50.

Transparent regions of quartz or a like material are formed by areas of the transparent plate 12 which are not covered by either of the phase shifting regions or the opaque regions.

Figure 2:
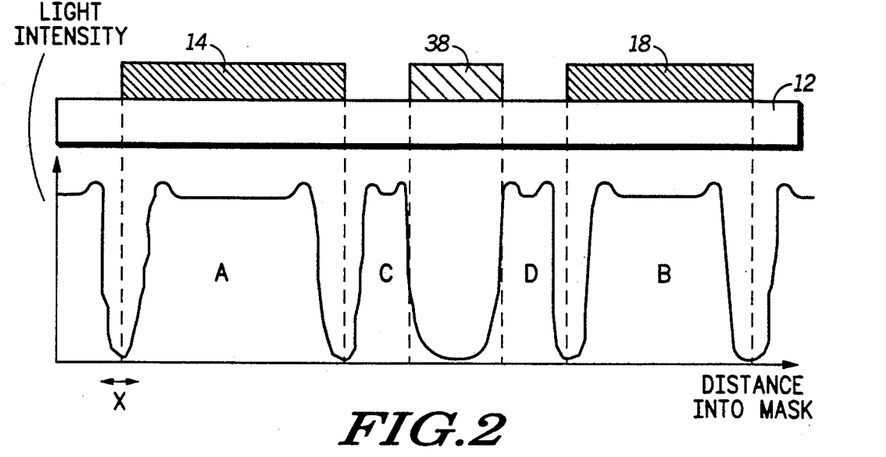
FIG. 2 illustrates, in cross-sectional form, light intensity exposure underneath the phase shifting mask of FIG. 1 which is cross-sectioned through line 2—2.

FIG. 2 illustrates the mask 11 of FIG. 1 cross-sectioned through a line 2—2. The transparent plate 12, phase shifting regions 14 and 18, and the opaque region 38 are illustrated. Although the relative thicknesses of materials in FIG. 2 are illustrated as being roughly equal, the thicknesses of the transparent plate 12, the phase shifting regions 14 and 18, and the opaque region 38 may vary to a large extent in most applications.

When light or like radiation is passed through the mask 12, spatial regions of high light intensity and spatial regions of low light intensity, known also as "dark" regions, result. These regions are illustrated in an X-Y plot in FIG. 2. The horizontal X-axis of the plot in FIG. 2 is labeled as a distance across the mask 11 and correlates with the overlying cross-section. The vertical Y-axis of the plot in FIG. 2 corresponds to the light intensity which is passed through the various regions of mask 11. It is important to note that the term "light", as used herein, means any form of electromagnetic radiation such as ultra-violet (UV) light, visible light, strobe sources, X-rays or any other form of energy or illumination.

It should be noted that X-ray masks are formed having different materials than most masks. X-ray masks have a substrate made of either silicon, silicon oxide, silicon nitride, SiC, diamond, sapphire or like substrate materials. In addition, X-ray masks have masking regions or opaque regions which are made of gold, copper, tungsten, platinum, and/or other heavy metals.

Transparent regions, such as the regions labeled C and D in FIG. 2, pass a high light intensity through the mask 11. The light passing through regions C and D is considered to have, or is referenced as having, a predetermined 0° phase shift. The regions underneath phase shifting regions, such as the regions labeled A and B, also have a high light intensity similar to regions C and D. One difference is that the light in regions A and B, due to the phase shifting material, is out of phase with the light in regions C and D. In a preferred form the light in regions A and B will be substantially 180° out of phase with the 0° phase shift light in regions C and D. In order to achieve a phase shift of 180°, thicknesses of phase shifting regions are formed according to:

$$t=\lambda/2(n-1)$$

wherein:
t = thickness of the phase shifting material
λ = wavelength of light or equivalent energy source
n = index of refraction of the phase shifting material.

It is important to note that alterations in light frequency, film thickness, film purity, and film composition may result in some variation in the 180° phase shift. In addition, other angles of phase shift, such as a 90° phase shift, or multiple phase shifting regions (i.e. 0°, 90°, 180°, and 270°.) may be desirable in some applications.

By placing 180° phase shifted light adjacent 0° phase shifted light, destructive interference occurs around between A and C and the region between B and D are "dark" regions of low light intensity. These destructively interfered regions have a width labeled "X" in FIG. 2 which may vary with light wavelength and film thicknesses. A typical width range for "X" is roughly 0.15 microns to 0.35 microns.

In FIG. 2, an opaque region 38 is illustrated. Opaque regions do not allow high intensities of light to pass. Therefore, the region underlying the opaque region 38 is a low intensity light region. The differences in the intensity of light after passing through a mask is used to selectively alter chemical and/or mechanical properties of photo-sensitive materials. Photo-sensitive materials, such as photoresists, are available commercially in many forms. For example, photoresists are available or used in many ways and are sometimes used with other materials. Positive photoresists are used, negative photoresists are used, image reversal photoresist techniques are used, multi-layer photoresists are used, contrast enhancement layers (CELs) improve photoresist quality, inorganic photoresists have been developed, dry-developable photoresists have been made, photosensitive oxides and polyimides are available, and mid-UV (ultra-violet), deep-UV, and X-ray photoresists are in use.

The photoresists which are most useful in conjunction with mask 11 are negative and positive photoresists. In a positive photoresist, areas exposed to light are less etch-resistant and are therefore easily removed in certain chemistries or developers, whereas unexposed areas are difficult to remove. The difference in etch resistance is usually caused by light-induced changes in a photoresist molecular weight or a photoresist chemical construction. In a negative photoresist, areas exposed to light are more etch-resistant and are therefore not easily removed in certain chemistries or developers, whereas unexposed areas are easy to remove.

Figure 3:
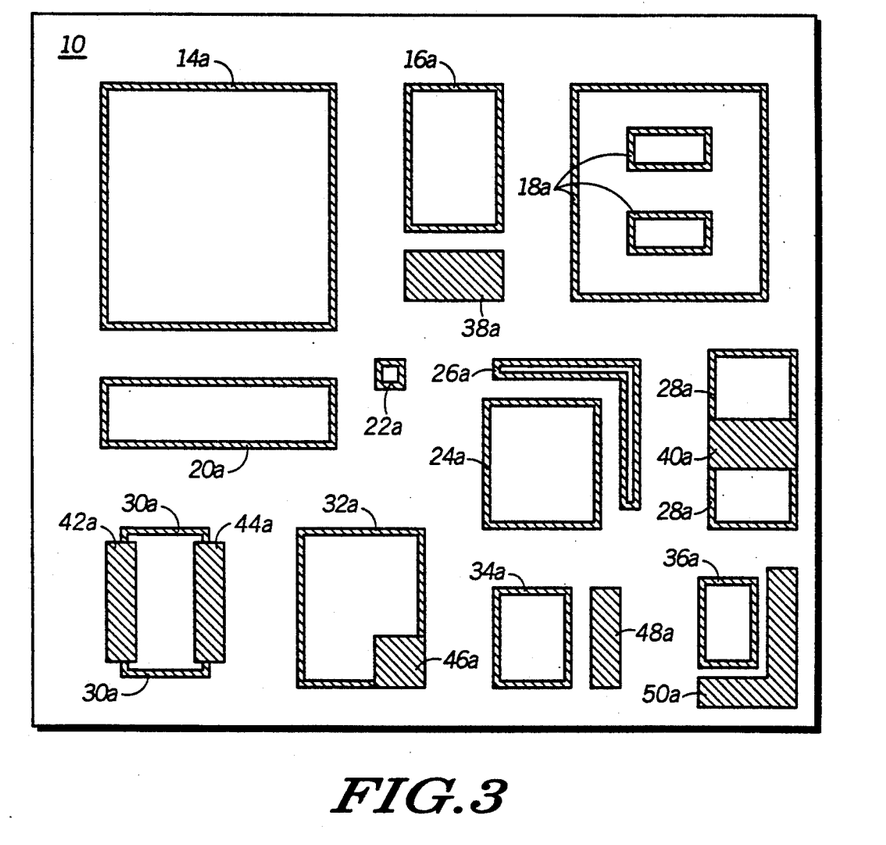
FIG. 3 illustrates in a top perspective view a semiconductor substrate having exposed and unexposed regions formed by being masked in a first position by the mask of FIG. 1.

In FIG. 3, a portion of a semiconductor wafer is illustrated. The wafer has a substrate 10. In a preferred from the substrate 10 is made of silicon which is usually single-crystalline. Other materials such as gallium arsenide, silicon on insulator (SOI) structures, epitaxial formations, germanium, germanium silicon, polysilicon, amorphous silicon, and/or like substrate or conductive materials may be used as substrate 10. The substrate 10 may have any number of device layers (not labeled or specifically illustrated) such as metals, silicides, conductive layers, oxides, nitrides, dielectric materials, spin on glasses, diffusions, or the like. A top portion of the semiconductor wafer is a photo-sensitive or photoresist layer of material.

The mask 11 of FIG. 1 is positioned over the substrate 10. A light source or energy source is used to expose regions of the photo-sensitive layer to form exposed regions of the photo-sensitive layer and unexposed regions of the photo-sensitive layer. The unexposed regions formed on the wafer resulting from light exposure through the mask 11 are illustrated in FIG. 3. Due to the explanations of phase shifting regions 14, 16, 18, 20, 22, 24, 26, 28, 30, 32, 34, and 36 and the opaque regions 38, 40, 42, 44, 46, 48, and 50 herein, and due to the light intensity regions illustrated in FIG. 2, the exposed and unexposed regions in FIG. 3 should be apparent although a more detailed explanation follows.

The phase shift regions 14, 16, 18, 20, 22, 24, 26, 28, 30, 32, 34, and 36 form unexposed regions of a photo-sensitive masking material around their peripheries due to the destructive interference "dark" regions formed at their respective peripheries. The opaque regions 38, 40, 42, 44, 46, 48, and 50 pass virtually no light and therefore form "dark" regions under their entire surface area as illustrated in FIG. 2. Unexposed regions 14a, 16a, 18a, 20a, 22a, 24a, 26a, 28a, 30a, 32a, 34a, and 36a in FIG. 3 result in the masking material from phase shifting material destructive interference regions or "dark" regions. Unexposed regions 38a, 40a, 42a, 44a, 46a, 48a, and 50a in FIG. 3 result from opaque regions 38, 40, 42, 44, 46, 48, and 50. All unexposed regions formed via the phase shifting regions 14, 16, 18, 20, 22, 24, 26, 28, 30, 32, 34, and 36 have a thin feature width of roughly 0.35 micron or less. The regions which are unexposed via the opaque regions 38, 40, 42, 44, 46, 48, and 50 are limited in minimum width via the minimum feature size of the opaque regions on the mask 11. The exposure step illustrated in FIG. 3 is referred to as the first exposure.

Although FIG. 3 does not specifically illustrate the mask 11 as overlying the substrate 10, the mask 11 is preferably not removed from the lithographic system. The mask 11 was removed from FIG. 3 to better illustrate the exposed and unexposed regions of the masking layer of substrate 10. The removal of the mask from the lithographic system would result in alignment tolerance issues. Unacceptable mask-to-wafer alignment sometimes arises when a mask is removed from a lithographic system and must subsequently be realigned to a previous position. In order to form the masking material structures illustrated in FIG. 3, the mask of FIG. 1 is positioned in a first position over the substrate 10 and exposed to an energy source or light.

Figure 4:
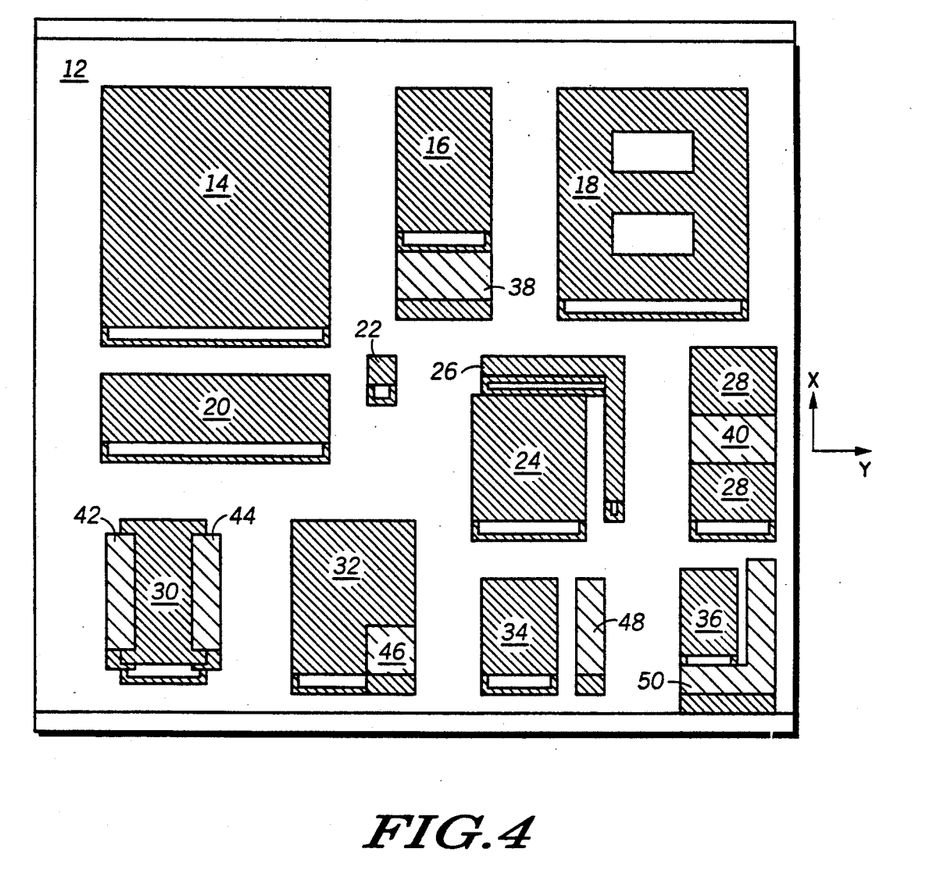
FIG. 4 illustrates in a top perspective view the mask of FIG. 1 positioned over the semiconductor substrate of FIG. 3 wherein the mask of FIG. 1 is shifted in an X direction from the first position of FIG. 3.

In FIG. 4, the mask 11 is shifted in an X direction to a second position from the first position used to expose the substrate 10 in FIG. 3. It is important to note that an underlying substrate or semiconductor wafer may be shifted instead of the mask in some embodiments. In FIG. 4, the mask 11 is illustrated as overlying the substrate 10, although the substrate 10, exposed regions, and unexposed region are not specifically labeled. A pair of axes in FIG. 4 illustrates both the X direction and a Y direction. The Y direction is orthogonal to the X direction. It should be noted that although FIG. 4 illustrates a shift in the positive X direction that shifting in the negative X direction is also possible. It should be noted that the distance with which the phase shifting mask 11 may be shifted ranges typically from a fraction of a micron to several hundred microns.

Figure 5:
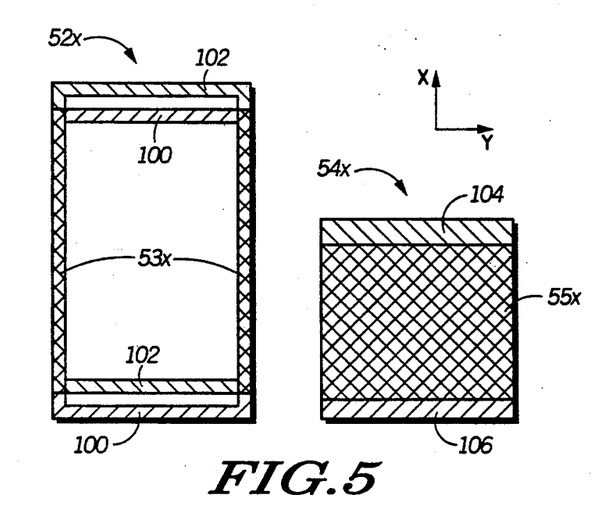
FIG. 5 illustrates, in a top perspective view, two features which occur on the semiconductor substrate of FIG. 3 when the mask of FIG. 1 is exposed in a first position and subsequently exposed in a second position wherein the second position is shifted in an X direction from the first position.

FIG. 5 illustrates two structures 52x and 54x which are formed on a photo-sensitive masking layer which is overlying a semiconductor wafer (not illustrated). The structures are labeled as structures 52x and 54x due to the fact that the structures 52x and 54x result from mask shifting in the X direction. The structure 52x has a first unexposed region 100 formed in a masking layer by light exposure through a phase shift mask region. The destructive interference at the edges of the phase shift material result in the unexposed region 100. The same phase shift region is shifted in the vertical X direction and exposed again to form the unexposed region 102 in the masking layer. Due to the double exposure, only the vertical lines 53x remain as unexposed regions. The horizontal line portions of regions 100 and 102 are exposed in one of the two exposures. Therefore, small resolution vertical lines may be made by an X shifting double exposure method.

The structure 54x has a first unexposed region 106 which is formed by illuminating an opaque region (not illustrated in FIG. 5) with light. The opaque region allows low light intensity or no light intensity to pass, therefore creating the unexposed region 106 in a portion of the masking layer which is underneath the opaque region. The opaque region is then shifted in the vertical X direction and a second exposure is performed. An unexposed region 104 is formed by the second exposure. Due to the double exposure, only region 55x remains completely unexposed after both exposures. Therefore, region 55x is the resulting unexposed region for both of the exposures. Notice that if the mask shifting distance which occurs between exposures is small compared to a width and a length of the opaque region, then the structure 54x is roughly the same shape as the opaque region itself.

Figure 6:
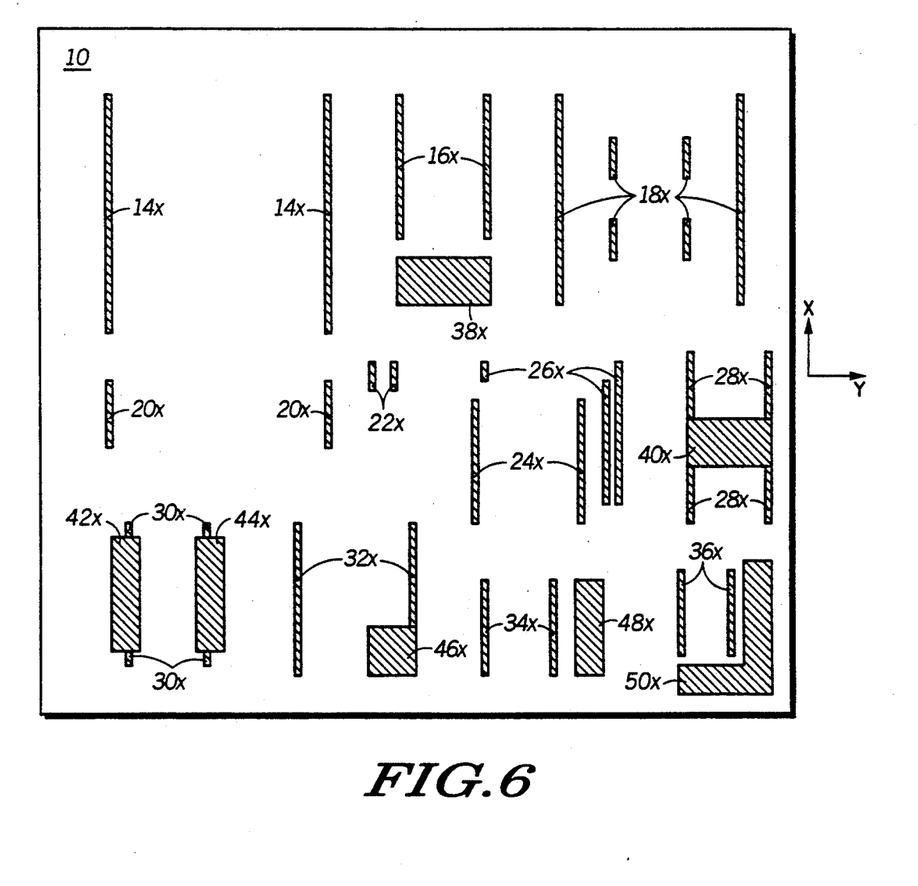
FIG. 6 illustrates in a top perspective view the semiconductor substrate of FIG. 3 after the semiconductor substrate of FIG. 3 is exposed as positioned in FIG. 4.

FIG. 6 illustrates the unexposed regions which result in the masking layer of FIG. 3 from a second exposure step with the mask 11 in a position as illustrated in FIG. 4. FIG. 5 illustrates the type of structures which result for opaque and phase shifting regions and is useful for understanding FIG. 6. FIG. 6 illustrates vertical lines 14x which result from a double exposure step which uses mask shifting in the X direction as illustrated in FIG. 4. In FIG. 6, vertical lines 14x, which are unexposed regions, result from the phase shifting region 14. Vertical lines 16x result via the phase shifting region 16. Vertical lines 18x are formed via phase shifting region 18. Vertical lines 20x are formed via phase shifting region 20. Short vertical lines 22x are formed via phase shifting region 22. Vertical lines 24x are formed via phase shifting region 24. Vertical lines 26x are formed via phase shifting region 26. Vertical lines 28x are formed via phase shifting region 28. Vertical lines 30x are formed via the phase shifting region 30. Vertical lines 32x are formed via phase shifting region 32. Vertical lines 34x are formed via phase shifting region 34. Vertical lines 36x are formed via phase shifting region 36. From FIG. 6 it is apparent that many different vertical line structures may be formed using different geometries of phase shifting regions.

In FIG. 6, an unexposed region 38x is formed via the opaque region 38. An unexposed region 40x is formed via the opaque region 40. An unexposed region 42x is formed via the opaque region 42. An unexposed region 44x is formed via the opaque region 44. An unexposed region 46x is formed via the opaque region 46. An unexposed region 48x is formed via the opaque region 48. An unexposed region 50x is formed via the opaque region 50. Therefore, many shapes such as horizontal lines, vertical lines, squares, rectangles, large geometries, contact pads, and the like may be formed via opaque regions during an X shifting procedure.

In some cases, unexposed regions are formed via opaque regions and phase shifting regions which overlap physically or overlap via mask shifting to form more complex geometries. It should be noted that it is intended in the figures included herein to cover all geometries resulting from shifted mask/double exposure techniques involving both phase shifting regions and phase shifting regions used with opaque regions.

In FIG. 6, the exposed and unexposed regions of the substrate 10 masking layer are used to form various masking features. Depending upon whether positive or negative photoresist is used, unexposed regions, such as vertical lines 14x and region 48x, may be used to form either holes in the masking layer or pillars of the masking layer. Holes in the masking layer may, for example, be used to form trench regions, isolation regions, and/or contact regions. By removing all of the exposed regions and leaving the vertical lines and the unexposed regions as a mask, small structures in oxide or conductive layers, such as thin address bus lines, thin interconnects, thin isolation regions, and/or the like, may be formed.

Figure 7:
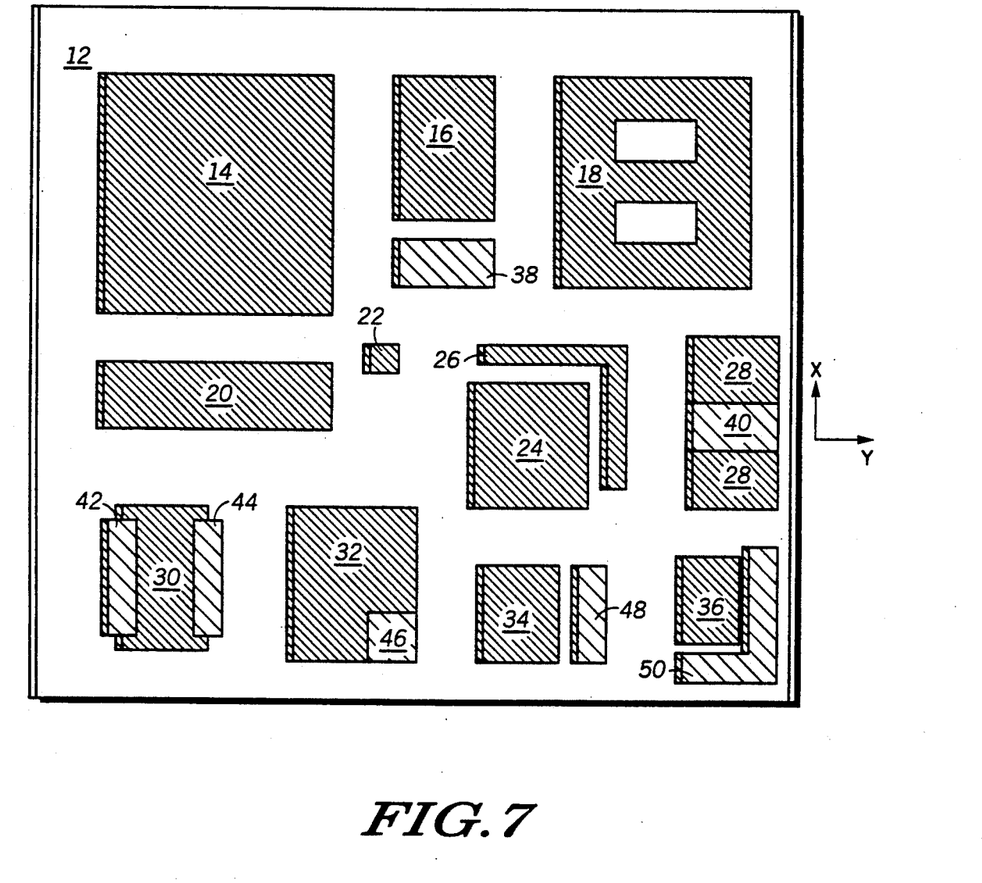
FIG. 7 illustrates in a top perspective view the mask of FIG. 1 positioned over the semiconductor substrate of FIG. 3 wherein the mask of FIG. 1 is shifted in a Y direction from the first position of FIG. 3.

In FIG. 7, the mask 11 is shifted in a horizontal Y direction to a second position. The second position is offset from the first position used to expose the substrate 10 in FIG. 3. In FIG. 7 the mask 11 is illustrated as overlying the substrate 10, although the substrate 10, exposed regions of the masking layer, and unexposed regions of the masking layer are not specifically labeled. A coordinate system in FIG. 7 illustrates both the X direction and the Y direction. It should be noted that although FIG. 7 illustrates a shift in the positive Y direction, shifting in the negative Y direction is possible.

Figure 8:
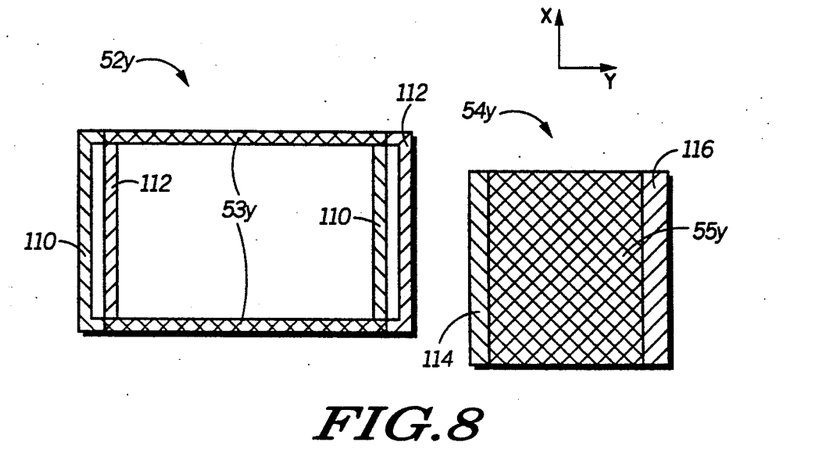
FIG. 8 illustrates, in a top perspective view, two features which occur on the semiconductor substrate of FIG. 3 when the mask of FIG. 1 is exposed in a first position and subsequently exposed in a second position wherein the second position is shifted in a Y direction from the first position.

FIG. 8 illustrates two structures 52y and 54y. The structure 52y has a first unexposed region 110 formed in the masking layer via light exposure through a phase shift mask region. The destructive interference at the edges of the phase shift material results in the unexposed region 110. The same phase shift region is shifted in the horizontal Y direction and exposed again to form the unexposed region 112 in the masking layer. Due to the double exposure, only the horizontal lines 53y remain as unexposed regions after both exposures. The vertical line portions of regions 110 and 112 are exposed in one of the two exposures. Therefore, small resolution horizontal lines may be made by a Y shifting double exposure method.

The structure 54y has a first unexposed region 114 which is formed by illuminating an opaque region with light. The opaque region allows low light intensity or no light intensity to pass therefore creating the unexposed region 114 in a portion of the masking layer which lies underneath the opaque region. The opaque region is then shifted in the horizontal Y direction and a second exposure is performed. An unexposed region 116 is formed via the second exposure. Due to the double exposure, only region 55y remains completely unexposed after both exposures. Therefore, region 55y is the resulting unexposed region (i.e. masking feature) for both of the exposures. Notice that if the mask shifting distance between exposures is small compared to the width of the opaque region, then the region 54y is roughly the same shape as the opaque region itself.

Figure 9:
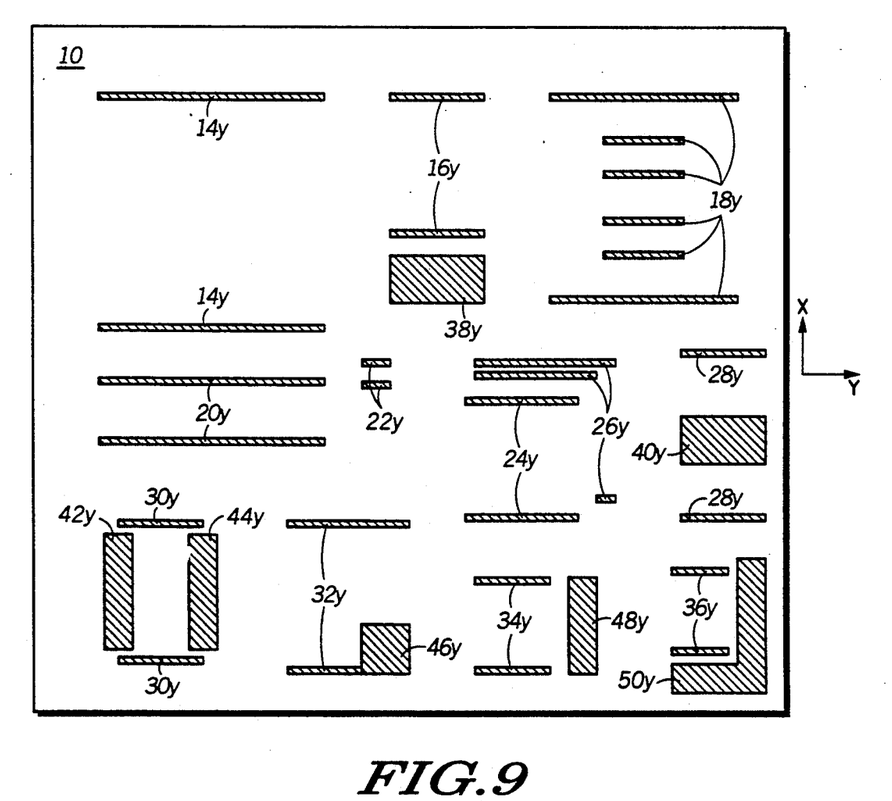
FIG. 9 illustrates in a top perspective view the semiconductor substrate of FIG. 3 after the semiconductor substrate of FIG. 3 is exposed as positioned in FIG. 7.

FIG. 9 illustrates the unexposed regions which result from a second exposure step with the mask 11 in a position as illustrated in FIG. 7. FIG. 8 illustrates the results for opaque and phase shifting regions and is useful when trying to understand FIG. 9. FIG. 9 illustrates horizontal lines 14y. Horizontal lines 14y are unexposed regions of the masking layer which result from a double exposure step which uses mask shifting in the Y direction. Horizontal lines 14y result from the phase shifting region 14. Horizontal lines 16y result via the phase shifting region 16. Horizontal lines 18y are formed via phase shifting region 18. Horizontal lines 20y are formed via phase shifting region 20. Short horizontal lines 22y are formed via phase shifting region 22. Horizontal lines 24y are formed via phase shifting region 24. Horizontal lines 26y are formed via phase shifting region 26. Horizontal lines 28y are formed via phase shifting region 28. Horizontal lines 30y are formed via the phase shifting region 30. Horizontal lines 32y are formed via phase shifting region 32. Horizontal lines 34y are formed via phase shifting region 34. Horizontal lines 36y are formed via phase shifting region 36. From FIG. 9 it is apparent that many different horizontal line structures may be formed using different geometries of phase shifting regions.

In FIG. 9, an unexposed region 38y is formed via the opaque region 38. An unexposed region 40y is formed via the opaque region 40. An unexposed region 42y is formed via the opaque region 42. An unexposed region 44y is formed via the opaque region 44. An unexposed region 46y is formed via the opaque region 46. An unexposed region 48y is formed via the opaque region 48. An unexposed region 50y is formed via the opaque region 50. Therefore, many shapes such as vertical lines, horizontal lines, squares, rectangles, large geometries, contact pads, and the like may be formed via opaque regions during a Y shifting procedure.

In many cases, unexposed regions are formed via opaque regions and phase shifting regions which overlap physically or overlap via mask shifting to form more complex geometries. It should be noted that it is intended in the figures included herein to illustrate a wide variety of geometries resulting from shifted mask/double exposure techniques involving both phase shifting regions and phase shifting regions used together with opaque regions. However, it should be apparent that other geometries may be formed when using the methods taught herein.

In FIG. 9, the exposed and unexposed regions of the substrate 10 masking layer are used to form masking features. Depending upon whether positive or negative photoresist is used, unexposed regions, such as horizontal lines 14y and region 48y, may be used to form either holes in the masking layer or pillars of the masking layer. The options and advantages of both of these techniques have been described herein.

Figure 10:
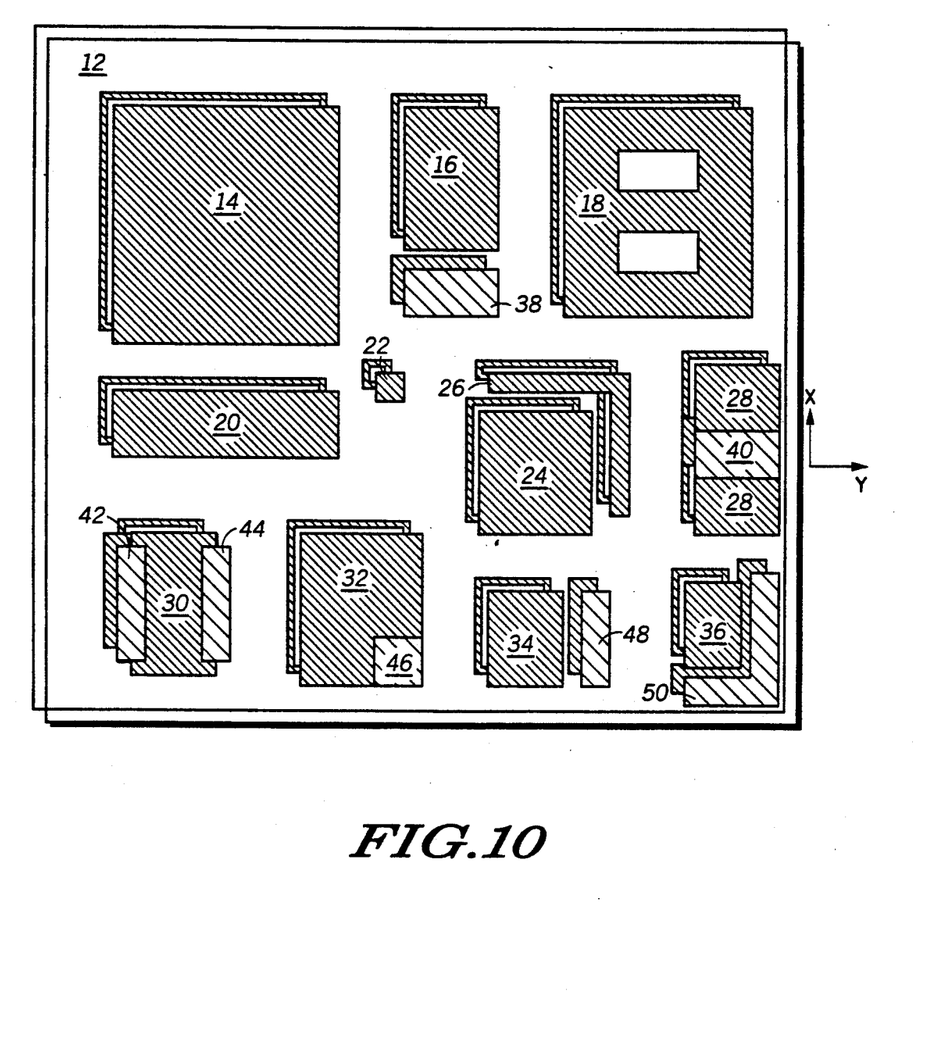
FIG. 10 illustrates in a top perspective view the mask of FIG. 1 positioned over the semiconductor substrate of FIG. 3 wherein the mask of FIG. 1 is shifted in both an X direction and a Y direction from the first position of FIG. 3.

In FIG. 10, the mask 11 is shifted in both an X direction and a Y direction to a second position from the first position used to expose the substrate 10 in FIG. 3. In FIG. 10 the mask 11 is illustrated as overlying the substrate 10, although the substrate 10, exposed regions, and unexposed region are not specifically labeled. Axes in FIG. 10 illustrates both the X direction and the Y direction. It should be noted that although FIG. 4 illustrates a shift in the negative X direction and a shift in the positive Y direction, shifting in either a positive or a negative direction in either the X direction and/or the Y direction is feasible.

Figure 11:
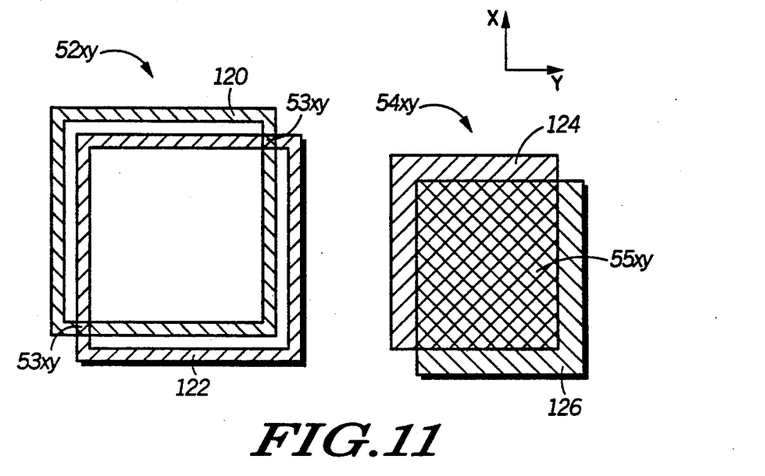
FIG. 11 illustrates, in a top perspective view, two features which occur on the semiconductor substrate of FIG. 3 when the mask of FIG. 1 is exposed in a first position and subsequently exposed in a second position wherein the second position is shifted both in an X direction and in a Y direction from the first position.

FIG. 11 illustrates two structures 52xy and 54xy. The structures are labeled as structures 52xy and 54xy due to the fact that the structures 52xy and 54xy result from mask shifting in both the X and Y direction. The structures 52xy and 54xy are formed onto a masking layer which overlies a substrate. The structure 52xy has a first unexposed region 120 formed by light exposure through a phase shift mask region (not illustrated in FIG. 11). The destructive interference at the edges of the phase shift material result in the unexposed region 120. The same phase shift region is shifted in the X direction and the Y direction, as illustrated, and is exposed a second time to form the unexposed region 122. Due to the double exposure, only the small regions 53xy remain as unexposed regions. The majority of the horizontal line portions and vertical line portions of regions 100 and 102 is exposed in one of the two exposures. Therefore, small resolution squares, circles, or rectangle areas may be made by an X and Y shifted double exposure method.

The structure 54xy has a first unexposed region 124 which is formed by illuminating an opaque region with light. The opaque region allows low light intensity or no light intensity to pass therefore creating the unexposed region 124 underneath the opaque regions entire surface area. The opaque region is then shifted in the X and Y direction and an unexposed region 126 is formed. Due to the double exposure, only region 55xy remains completely unexposed after both exposures. Therefore, region 55xy is the resulting unexposed region for both of the exposures. Notice that if the mask shifting distance between exposures is small compared to a width and a length of the opaque region, then the region 54xy is roughly the same shape as the opaque region itself.

Figure 12:
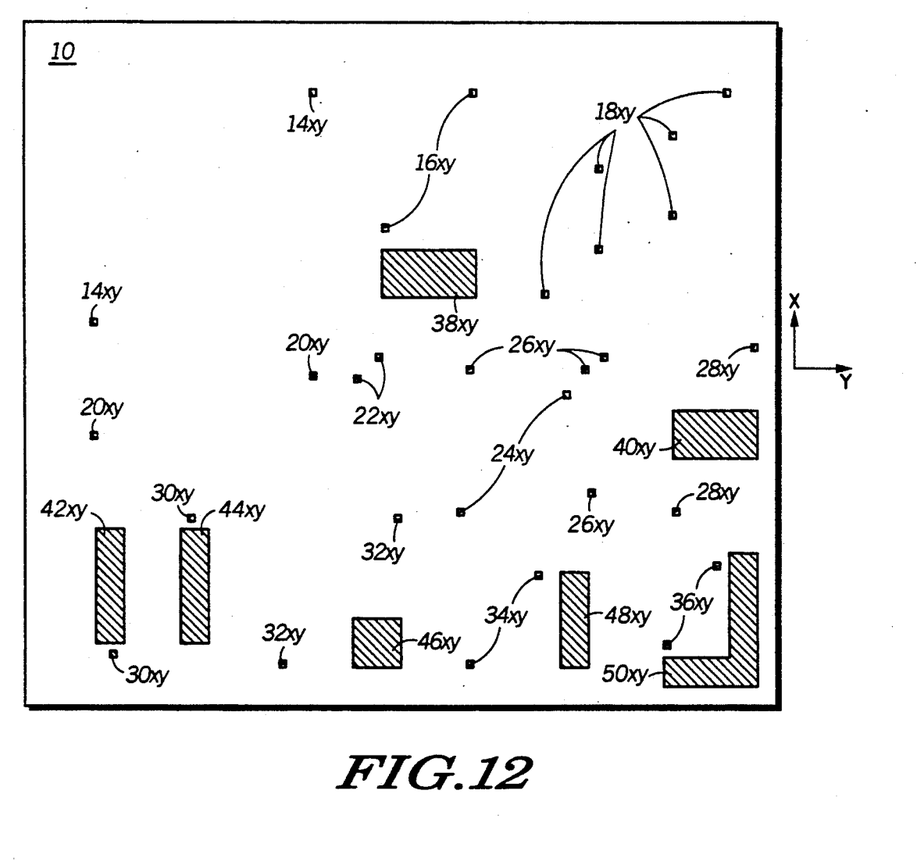
FIG. 12 illustrates in a top perspective view the semiconductor substrate of FIG. 3 after the semiconductor substrate of FIG. 3 is exposed as positioned in FIG. 10.

FIG. 12 illustrates the unexposed regions which result from a second exposure step with the mask 11 in a position as illustrated in FIG. 10. FIG. 11 illustrates the results for opaque and phase shifting regions and is useful when trying to understand FIG. 12. FIG. 12 illustrates small unexposed regions 14xy which result from a double exposure step. The double exposure step uses mask shifting in both the X and Y direction. Small unexposed regions 14xy result from the phase shifting region 16. Small unexposed regions 16xy result via the phase shifting region 16. Small unexposed regions 18xy are formed via phase shifting region 18. Small unexposed regions 20xy are formed via phase shifting region 20. Small unexposed regions 22xy are formed via phase shifting region 22. Small unexposed regions 24xy are formed via phase shifting region 24. Small unexposed regions 26xy are formed via phase shifting region 26. Small unexposed regions 28xy are formed via phase shifting region 28. Small unexposed regions 30xy are formed via the phase shifting region 30. Small unexposed regions 32xy are formed via phase shifting region 32. Small unexposed regions 34xy are formed via phase shifting region 34. Small unexposed regions 36xy are formed via phase shifting region 36. From FIG. 12 it is apparent that many different geometries of small unexposed regions may be formed using different geometries of phase shifting regions and opaque regions.

In FIG. 12, an unexposed region 38xy is formed via the opaque region 38. An unexposed region 40xy is formed via the opaque region 40. An unexposed region 42xy is formed via the opaque region 42. An unexposed region 44xy is formed via the opaque region 44. An unexposed region 46xy is formed via the opaque region 46. An unexposed region 48xy is formed via the opaque region 48. An unexposed region 50xy is formed via the opaque region 50. Therefore, many shapes such as horizontal line, vertical lines, squares, rectangles, large geometries, contact pads, and the like may be formed via opaque regions during an X and Y shifting procedure.

In many cases, unexposed regions formed via opaque regions and small unexposed regions formed via phase shifting regions may be used together to form more complex geometries. It should be noted that it is intended in the figures included herein to cover all geometries resulting from X and Y shifted mask/double exposure techniques involving both phase shifting regions and phase shifting regions used together with opaque regions.

In FIG. 12, the exposed and unexposed regions of the substrate 10 masking layer are used to form various masking features. Unexposed regions, such as small unexposed regions 14xy and unexposed region 48xy, may be used to form contact holes, via holes, and the like in the masking layer overlying substrate 10, or may be used to form small pillars of the masking layer to create small geometries or features in oxides or conductive layers. Contact holes, vias, or pillars on the order of 0.25 micron are very advantageous for device formations in the integrated circuit industry. Notice that if small phase shifting regions are formed on a mask, small single isolated contacts may be formed via X and Y shifting instead of the pairs of contacts illustrated in FIG. 12.

Figure 13:
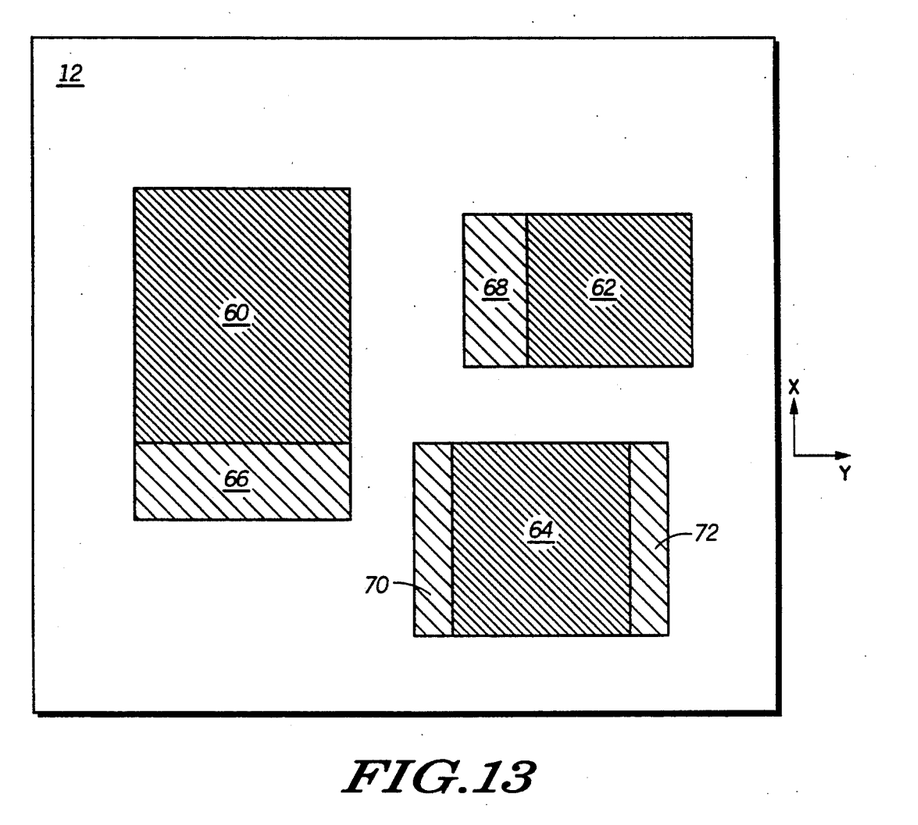
FIG. 13 illustrates in a top perspective view another phase shifting mask in accordance with the present invention.

In FIG. 13, a mask is illustrated as having the transparent plate 12. In addition, the mask has phase shifting regions 60, 62 and 64 and opaque regions 66, 68, 70, and 72. The phase shifting regions are preferably an oxide or a nitride, and the opaque regions are preferably a chrome and/or chrome oxide.

Figure 14:
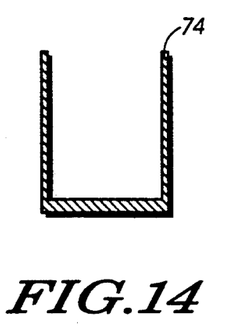
FIGS. 14-16 each illustrate in a top perspective view several unexposed regions which will result on a semiconductor masking layer when using the mask of FIG. 13.

FIG. 14 illustrates an unexposed region 74 which would result in a substrate masking layer if the combined structure of phase shifting region 60 and opaque region 66 of FIG. 13 were double exposed over a substrate via shifting in the X direction as described herein. The "horseshoe" or "U" shaped unexposed region 74 may be formed for use in isolation structures, interconnects, metal or polysilicon routing, and/or the like.

Figure 15:
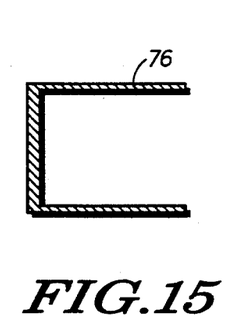

FIG. 15 illustrates an unexposed region 76 which would result in a substrate masking layer if the combined structure of phase shifting region 62 and opaque region 68 of FIG. 13 were double exposed over the substrate via shifting in the Y direction as described herein. The "horseshoe" or "C" shaped unexposed region 76 may be formed for use in isolation structures, interconnects, metal or polysilicon routing, and/or the like.

Figure 16:
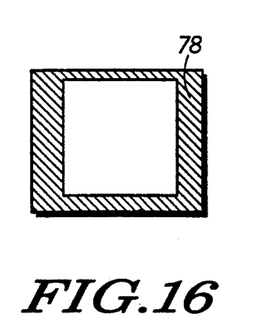

FIG. 16 illustrates an unexposed region 78 which would result in a substrate masking layer if the combined structure of phase shifting region 64 and opaque regions 70 and 72 of FIG. 13 were double exposed over the substrate via shifting in the Y direction as described herein. The "circular" or "O" shaped unexposed region 78 may be formed for use in isolation structures, integrated circuit devices, small implantation regions, memory structure formations, and/or the like.

It should be emphasized that the structures illustrated in FIG. 13 may be rotated 90° and/or shifted in any manner to form other geometric unexposed regions. These other geometric unexposed regions would be similar to the structures 74, 76, and 78 of FIGS. 14–16.

Figure 17:
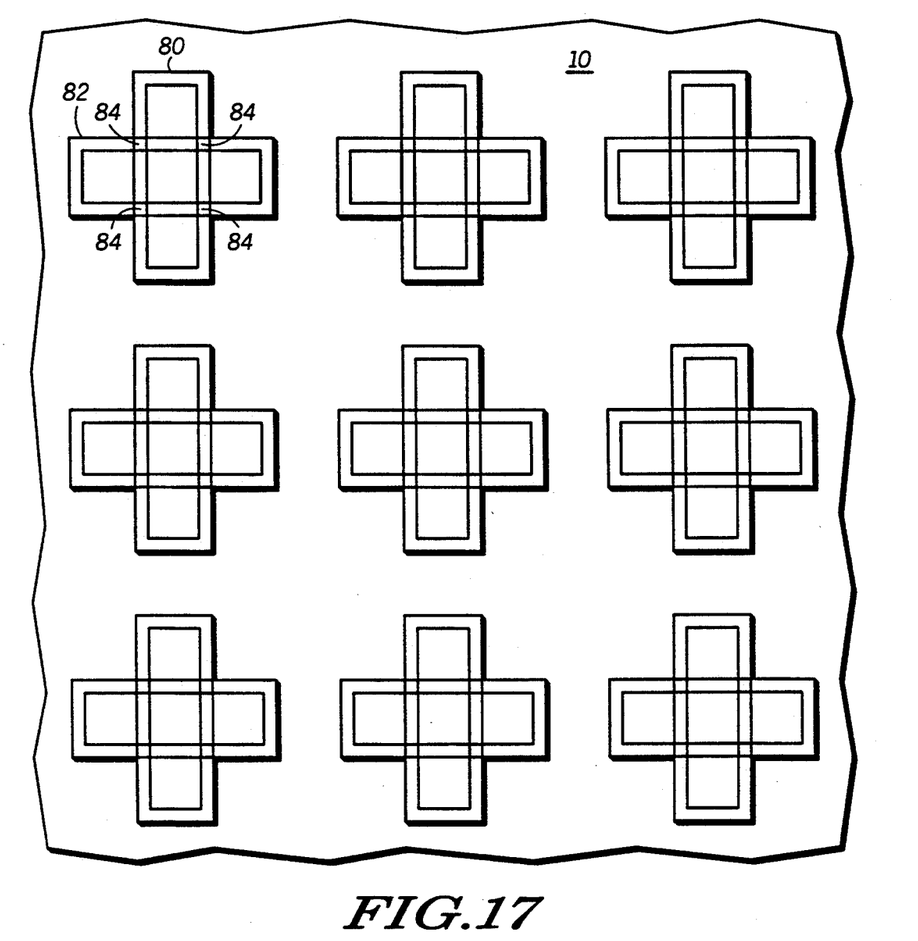
FIG. 17 illustrates, in a top perspective view, several features which occur on a semiconductor substrate masking layer when a double exposure technique is used in accordance with the present invention.

FIG. 17 illustrates the formation of small contact holes, vias, or small vertical pillar-like structures from either multiple masks or mask rotating. FIG. 17 illustrates nine identical structures wherein one of the nine structures is labeled. The one labeled structure has an unexposed region 80 formed by a first exposure with a first mask. A second unexposed region 84 is formed via a second mask or via a rotation of the first mask. Due to this double exposure process four small unexposed regions 84 are formed. This technique may be very useful in forming repetitive contact patterns which are found in memory cells such as static random access memories (SRAMs), dynamic random access memories (DRAMs), and the like. It should be apparent that other geometries besides rectangles may be used to form rotated or double mask/double exposure features on an integrated circuit or masking layer.

It should be noted that although most of the examples discussed herein use the same or one phase shifting mask to create features through double exposure, two different masks may be used through double exposure to perform a similar function.

Figure 18:
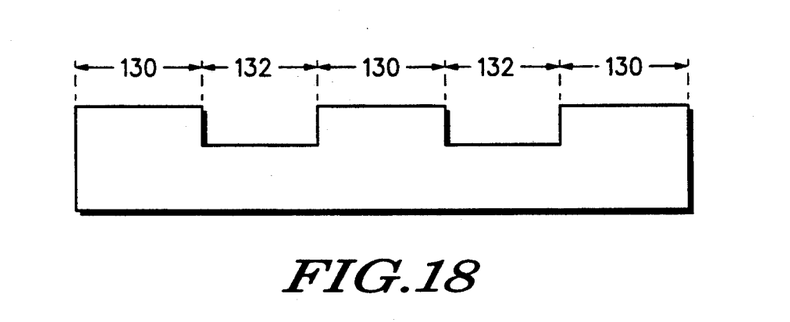
FIG. 18 illustrates, in cross-sectional form, an alternative phase shifting mask which may be used in accordance with the present invention.

In FIG. 18, an alternative phase shifting mask is illustrated. Instead of using nitride or oxide phase shifting material over a quartz plate, etch trenching of a quartz mask plate or a calcium fluoride mask plate may be used to form a phase shifting mask. FIG. 18 illustrates a mask having trench regions 132 and nontrenched regions 130. Due to the fact that air and quartz material or calcium fluoride material each have a different index of refraction, phase shifting is accomplished via trenching a mask to form air regions where there once were mask material regions. It is important to note that any known phase shifting mask may be used for the methods discussed herein.

In summary, a lithographic method is described wherein both large masking geometries and sub-micron masking features are formed on a semiconductor die or wafer. The semiconductor die or wafer has a top surface covered by a masking layer, such as a photo-sensitive layer or a photoresist layer. The mask and mask processing which is used to form the masking features preferably use phase shifting of light via a phase shifting mask. Several structures and embodiments of phase shifting, double exposure, and mask shifting, along with several phase shifting mask structures, are described and illustrated herein.

In one form, a first phase shifting mask is positioned in a first position over the semiconductor die or wafer. The semiconductor wafer is exposed to light wherein the light passes through the phase shifting mask. This exposure forms first exposed regions and first unexposed regions on the masking layer of the semiconductor wafer. The phase shifting mask is shifted in an X direction, an orthogonal Y direction, and/or a rotational direction to a second position, or is replaced by a second mask which is positioned in the second position. A second exposure is used to form second exposed regions and second unexposed regions. The second unexposed regions have a surface area smaller than the first unexposed region's surface area and are a subset of the first unexposed regions formed by the first mask exposure.

This method is used to form contact holes, lines, and geometric mask features which are not possible via conventional lithography and are very small (i.e. minimum feature size of 0.25 micron or below). In addition, the 0.25 micron feature sizes are formed through light interference. Therefore, the feature sizes in the masking layer are capable of being much smaller than the feature sizes of the phase shifting regions or opaque regions formed on the phase shifting mask. In other words, the feature sizes on the masking layer are not limited by mask feature sizes or mask region resolution.

While the present invention has been illustrated and described with reference to specific embodiments, further modifications and improvements will occur to those skilled in the art. For example, the geometries and feature shapes illustrated herein are not exhaustive. Many other features shapes and geometries may be formed using the methods taught herein. X, Y, and rotational displacements may be used in combination with each other in either the negative or positive directions. The masking layer is not limited to photoresists and the photoresists may be used to form hard mask layers. Again, light, as used herein, is intended to mean any type of radiation source which could affect a masking layer such as visible light, UV light, X-rays, and the like. Many different types of photoresist exist commercially and are applicable to the inventive methods disclosed herein. X, Y, and a rotational coordinate was used herein to describe the placement of masks. This cylindrical-like coordinate scheme may be easily replaced by other coordinate schemes without departing from the scope of this invention.

The opaque and phase shifting regions discussed herein may be used together in several manners with the inventive methods disclosed herein. Many different layers, devices, or structures may result from the techniques discussed herein. It is possible to have a method requiring multiple exposures wherein the number of exposures is greater than two. The phrase "shifting the phase shifting mask" as used herein means shifting the relative position between the phase shifting mask and the semiconductor wafer in any manner. For example, lithographic equipment wherein the mask is physically fixed and the wafer moves about on a controllable X-Y table has been designed and built. This type of wafer shifting may be used herein in place of mask shifting to change mask-to-wafer positioning. It is important to note that the method taught herein may be used to form features onto any substrate material, or may be used to form other devices. These substrates or devices may include PC boards, circuit boards, wave guide devices, multi-chip modules, diffraction pattern devices and the like. It is also important to note that one positioning and exposure step may be performed in a first lithographic system and a second positioning and exposure may be performed in a second lithographic system. Furthermore, the type of radiation for each exposure may vary. For example, the first exposure to radiation may include visible phase-shifted light or the like, whereas the second exposure may include EBL, X-rays, or the like. It is to be understood, therefore, that this invention is not limited to the particular forms illustrated and that it is intended in the appended claims to cover all modifications that do not depart from the spirit and scope of this invention.

I claim:

1. A method for forming masking features upon a substrate wherein the substrate has a top surface made of a masking layer, the method comprising the steps of:
    positioning a first phase shifting mask in a first position in close proximity to the substrate, the first position masking a first surface area of the masking layer;
    exposing the masking layer to radiation wherein the radiation is passed through the first phase shifting mask to form a first plurality of exposed regions of the masking layer;
    positioning a second phase shifting mask in a second position in close proximity to the substrate, the second position masking a second surface area of the masking layer wherein the second surface area at least partially overlaps the first surface area; and
    exposing the masking layer to radiation wherein the radiation is passed through the second phase shifting mask to form a second plurality of exposed regions of the masking layer, the second plurality of exposed regions being positioned differently from the first plurality of exposed regions but partially overlapping the first plurality of exposed regions, the first and second plurality of exposed regions being used to define said masking features.

2. The method of claim 1 wherein both the steps of positioning the first and second phase shifting masks comprise:
    using a separate mask for each of the first and second phase shifting masks, each separate mask having at least one transparent region wherein the at least one transparent region passes radiation with a predefined 0° phase shift, and having at least one phase shifting region wherein the at least one phase shifting region passes the radiation, the radiation passed by the at least one phase shifting region being phase shifted in comparison to the radiation passed by the at least one transparent region.

3. The method of claim 1 wherein the step of positioning the first phase shifting mask comprises:
    using a mask having at least one opaque region and at least one phase shifting region formed on the first phase shifting mask.

4. The method of claim 1 wherein the step of positioning the second phase shifting mask comprises:
    using a mask having at least one opaque region and at least one phase shifting region formed on the second phase shifting mask.

5. The method of claim 1 wherein the steps of positioning comprise:
    having at least one region which comprises chrome overlying one of either the first phase shifting mask or the second phase shifting mask.

6. The method of claim 1 wherein the steps of positioning the first and second phase shifting masks respectively to the first position and second position comprise:
    positioning the second phase shifting mask wherein the second position is relative to the first position in a direction selected from a group consisting of: a first direction parallel to a plane of the first phase shifting mask, a second direction orthogonal to the first direction and parallel to the plane of the phase shifting mask, a third direction derived from both the first and second directions, and a fourth direction which is rotational in comparison to the first direction and is within the plane of the first phase shifting mask.

7. The method of claim 1 wherein the step of exposing through the first phase shifting mask results in a first region of radiation being transmitted through a first portion of the first phase shifting mask and a second region of radiation being transmitted through a second portion of the first phase shifting masks, wherein the first region of radiation is defined as having a 0° phase shift and the second region of radiation is substantially 180° out of phase with the first region of radiation.

8. The method of claim 1 wherein the masking features which are formed are features selected from a group consisting of: square holes, sub-0.35 micron contact holes, rectangular holes, square pillar regions, rectangular pillar regions, and sub-0.35 micron pillar regions.

9. A method for forming masking features upon a substrate wherein the substrate has a top surface made of a masking layer, the method comprising the steps of:
 positioning a phase shifting mask in a first position in close proximity to the substrate, the first position exposing a first surface area of the masking layer;
 exposing the masking layer to first radiation wherein the first radiation is passed through the phase shifting mask to form a first plurality of exposed areas of the masking layer;
 positioning the phase shifting mask in a second position in close proximity to the substrate, the second position exposing a second surface area of the masking layer wherein the second surface area and the first surface area at least partially coincide; and
 exposing the masking layer to second radiation wherein the second radiation is passed through the phase shifting mask to form a second plurality of exposed areas of the masking layer, the first plurality of exposed areas partially overlapping the second plurality of exposed areas.

10. The method of claim 9 wherein both the steps of positioning the phase shifting mask comprise:
 providing at least one transparent region in the phase shifting mask wherein the at least one transparent region passes radiation with a pre-defined 0° phase shift and has at least one phase shifting region wherein the at least one phase shifting region passes radiation, the radiation being phase shifted in comparison to the radiation passed by the at least one transparent region.

11. The method of claim 9 wherein both the steps of positioning the phase shifting mask comprise:
 using a mask having at least one opaque region and at least one phase shifting region as the phase shifting mask.

12. The method of claim 9 wherein both the steps of positioning the phase shifting mask comprise:
 using a mask having at least one region which comprises chrome overlying the phase shifting mask.

13. The method of claim 9 wherein the steps of positioning the phase shifting mask respectively in the first position and second position comprise:
 positioning the phase shifting mask wherein the second position is relative to the first position in a direction selected from a group consisting of: a first direction parallel to a plane of the phase shifting mask, a second direction orthogonal to the first direction and parallel to the plane of the phase shifting mask, a third direction derived from both the first and second directions, and a fourth direction which is rotational in comparison to the first direction and is within the plane of the phase shifting mask.

14. The method of claim 9 wherein at least one of the steps of exposing the phase shifting mask result in a first region of radiation being transmitted through a first portion of the phase shifting mask and a second region of radiation being transmitted through a second portion of the phase shifting mask, wherein the first region of radiation is defined as having a 0° phase shift and the second region of radiation is substantially 180° out of phase with the first region of radiation.

15. The method of claim 9 wherein the masking features which are formed are features selected from a group consisting of: square holes, sub-0.35 micron contact holes, rectangular holes, square pillar regions, rectangular pillar regions, and sub-0.35 micron pillar regions.

16. A method for forming masking features upon a semiconductor wafer wherein the semiconductor wafer has a top surface made of a masking layer, the method comprising the steps of:
 positioning a phase shifting mask in a first position adjacent the semiconductor wafer, the first position being adjacent a first surface area of the masking layer;
 exposing the masking layer to light wherein the light is passed through the phase shifting mask, the light forming an exposed region of the masking layer, the exposed region having an exposed surface area;
 positioning the phase shifting mask in a second position adjacent the semiconductor wafer wherein the second position is different from the first position, the second position being adjacent a second surface area of the masking layer wherein the first and second surface areas partially overlap; and
 exposing the masking layer to light wherein the light is passed through the phase shifting mask, the light enlarging the exposed surface area of the exposed region of the masking layer within the first surface area.

17. The method of claim 16 wherein both the steps of positioning the phase shifting mask comprise:
 providing at least one transparent region in the phase shifting mask wherein the at least one transparent region passes light with a pre-defined 0° phase shift and has at least one phase shifting region wherein the at least one phase shifting region passes light, the light being phase shifted in comparison to the light passed by the at least one transparent region.

18. The method of claim 16 wherein both the steps of positioning the phase shifting mask comprise:
 providing at least one opaque region formed on the phase shifting mask.

19. The method of claim 16 wherein both the steps of positioning the phase shifting mask comprise:
 having one or more chrome regions overlying the phase shifting mask.

20. The method of claim 16 wherein the step of positioning the phase shifting mask to the second position comprises:
 positioning the phase shifting mask wherein the second position is relative to the first position in a direction selected form a group consisting of: a first direction parallel to a plane of the phase shifting mask, a second direction orthogonal to the first direction and parallel to the plane of the phase shifting mask, a third direction derived from both the first and second directions, and a fourth direction which is rotational in comparison to the first direction and is within the plane of the phase shifting mask.

21. The method of claim 16 wherein each of the steps of exposing the phase shifting mask results in a first region of light being transmitted through a first portion of the phase shifting mask and a second region of light being transmitted through a second portion of the phase shifting mask, wherein the first region of light is defined as having a 0° phase shift and the second region of light is substantially 180° out of phase with the first region of light.

22. The method of claim 16 comprising a step of forming said masking features having a minimum feature size which is less than a minimum resolution feature size of any region formed both on or within the phase shifting mask.

23. A method for forming masking features upon a silicon semiconductor wafer wherein the silicon semiconductor wafer has a top surface made of a photo-sensitive layer, the method comprising the steps of:
 positioning a phase shifting mask in a first position in close proximity to the semiconductor wafer, the first position masking a first surface area of the photo-sensitive layer;
 exposing the photo-sensitive layer to light wherein the light is passed through the phase shifting mask to form both first exposed regions of the photo-sensitive layer and first unexposed regions of the photo-sensitive layer, the first unexposed regions having a first unexposed total surface area;
 positioning the phase shifting mask in a second position in close proximity to the semiconductor wafer wherein the second position is different from the first position, the second position masking a second surface area of the photo-sensitive layer wherein the second surface area partially coincides with the first surface area;
 exposing the photo-sensitive layer to light wherein the light is passed through the phase shifting mask to form second exposed regions of the photo-sensitive layer and second unexposed regions of the photo-sensitive layer, the second unexposed regions having a second unexposed total surface area wherein the second unexposed total surface area is less than the first unexposed total surface area and;
 selectively removing portions of one of either the first and second exposed regions or the first and second unexposed regions to form said masking features.

24. The method of claim 23 wherein both the steps of positioning the phase shifting mask comprise:
 providing at least one transparent region in the phase shifting mask wherein the at least one transparent region passes light with a pre-defined 0° phase shift and has at least one phase shifting region wherein the at least one phase shifting region passes light, the light being phase shifted in comparison to the light passed by the at least one transparent region.

25. The method of claim 23 wherein the phase shifting mask comprises either a nitride material or an oxide material used as a phase shifting material.

26. A method for forming masking features upon a silicon semiconductor wafer wherein the silicon semiconductor wafer has a top surface made of a photoresist layer, the method comprising the steps of:
 positioning a phase shifting mask in a first position adjacent the semiconductor wafer, the first position exposing a first surface area of the photoresist layer, the phase shifting mask having at least one transparent region wherein the at least one transparent region passes light with a pre-defined 0° phase shift, and having at least one phase shifting region wherein the at least one phase shifting region passes light, the light being phase shifted in comparison to the light passed by the at least one transparent region;
 exposing the photoresist layer to light wherein the light is passed through the phase shifting mask, a first region of light being transmitted through the at least one transparent region and a second region of light is transmitted through the at least one phase shifting region, wherein the first region of light is defined as having a 0° phase shift and the second region of light is substantially phase shifted in comparison to the first region of light to form both exposed regions and unexposed destructive interference regions of the photoresist layer;
 positioning the phase shifting mask in a second position adjacent the semiconductor wafer wherein the second position is different from the first position, the second position exposing a portion of the first surface area of the photoresist layer;
 exposing the photoresist layer to light wherein the light is passed through the phase shifting mask to reduce the surface area of the unexposed destructive interference regions of the masking layer to form said masking features from said photoresist layer and;
 selectively removing portions of the photoresist layer to form said masking features.

27. A method for forming masking features upon a semiconductor wafer wherein the semiconductor wafer has a top surface made of a masking layer, the method comprising the steps of:
 positioning a phase shifting mask in a first position in close proximity to the semiconductor wafer, the first position being aligned adjacent a first surface area of the masking layer;
 forming a first plurality of unexposed regions from the masking layer through selective energy exposure through the phase shifting mask;
 positioning the phase shifting mask in a second position in close proximity to the semiconductor wafer wherein the second position is different from the first position, the second position being aligned adjacent a portion of the first surface area of the masking layer wherein the first surface area is partially exposed by the phase shifting mask while the phase shifting mask is in the second position; and
 forming a second plurality of unexposed regions from the masking layer through the selective energy exposure through the phase shifting mask, the second plurality of unexposed regions being positioned differently from the first plurality of unexposed regions, the combination of the first and second pluralities of unexposed regions being used to form said masking features from the masking layer.

28. The method of claim 9 wherein the steps of exposing comprises:
 making the first radiation and the second radiation substantially the same with respect to intensity wherein the first radiation and the second radiation are produced by the same radition source.

* * * * *